United States Patent
Carey et al.

(10) Patent No.: US 7,460,343 B2
(45) Date of Patent: *Dec. 2, 2008

(54) MAGNETIC READ SENSOR EMPLOYING OBLIQUE ETCHED UNDERLAYERS FOR INDUCING UNIAXIAL MAGNETIC ANISOTROPY IN A HARD MAGNETIC IN-STACK BIAS LAYER

(75) Inventors: Matthew Joseph Carey, San Jose, CA (US); Jeffrey Robinson Childress, San Jose, CA (US); Eric Edward Fullerton, Morgan Hill, CA (US); Stefan Maat, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 615 days.

This patent is subject to a terminal disclaimer.

(21) Appl. No.: 11/097,638

(22) Filed: Mar. 31, 2005

(65) Prior Publication Data

US 2006/0221513 A1    Oct. 5, 2006

(51) Int. Cl.
*G11B 5/39*    (2006.01)
(52) U.S. Cl. .............................. 360/324.12; 360/324.2
(58) Field of Classification Search ............ 360/324.12, 360/324.2
See application file for complete search history.

(56) References Cited

U.S. PATENT DOCUMENTS

| 3,943,047 | A | 3/1976 | Cruzan et al. ............... 204/192 |
| 4,309,267 | A | 1/1982 | Boyd et al. ................. 204/298 |
| 5,143,794 | A | 9/1992 | Suzuki et al. ............... 428/611 |
| 5,759,682 | A | 6/1998 | Ouchi et al. ................. 428/332 |
| 5,815,343 | A | 9/1998 | Ishikawa et al. ......... 360/97.01 |
| 6,007,623 | A | 12/1999 | Thiele et al. .................. 117/95 |
| 6,086,974 | A | 7/2000 | Thiele et al. ............... 428/65.3 |
| 6,169,303 | B1 | 1/2001 | Anthony ..................... 257/295 |
| 6,331,364 | B1 | 12/2001 | Baglin et al. ............. 428/694 T |
| 6,735,850 | B1 | 5/2004 | Gibbons et al. .......... 29/603.07 |
| 6,743,529 | B2 | 6/2004 | Saito et al. ............ 428/694 SG |
| 2002/0051328 | A1 | 5/2002 | Hasegawa .................... 360/322 |
| 2006/0221515 | A1* | 10/2006 | Carey et al. ............ 360/324.12 |

OTHER PUBLICATIONS

D. Sekiba, R. Moroni, G. Gonella, F. Buatier de Mongeot, C. Boragno, L. Mattera, and U. Valbusa, "Uniaxial magnetic anisotropy tuned by nanoscale ripple formation: Ion-sculpting of Co/Cu(001) thin films," Applied Physics Letters, vol. 84 No. 5, Feb. 2004.

(Continued)

*Primary Examiner*—Craig A Renner
(74) *Attorney, Agent, or Firm*—Zilka-Kotab, PC

(57) ABSTRACT

A magnetoresistive sensor having an in stack bias layer with an engineered magnetic anisotropy in a direction parallel with the medium facing surface. The in-stack bias layer may be constructed of CoPt, CoPtCr or some other magnetic material and is deposited over an underlayer that has been ion beam etched. The ion beam etch has been performed at an angle with respect to normal in order to form anisotropic roughness in form of oriented ripples or facets. The anisotropic roughness induces a uniaxial magnetic anisotropy substantially parallel to the medium facing surface in the hard magnetic in-stack bias layer deposited thereover.

31 Claims, 7 Drawing Sheets

OTHER PUBLICATIONS

Dr. Chen Yunjie, "Highly Oriented Media for High Density Magnetic Recording," Storage Unlimited, Jul.-Sep. 2004.

S. Rusponi, G. Costantini, F. Buatier de Mongeot, C. Boragno, and U. Valbusa, "Patterning a surface on the nanometric scale by ion sputtering," Applied Physics Letters, vol. 75 No. 21, Nov. 1999.

J.E. Lee, Y. Roh, S.C. Oh, H.-J. Kim, Y.K. Ha, J.S. Bae, I.G. Baek, S.O. Park, U.-I. Chung. and J.T. Moon, "Improved Magnetic Tunnel Junction With Amorphous Seed Layer, Surface Treatment, and High-Polarization Magnetic Materials," IEEE Transactions on Magnetics, vol. 40, No. 4, Jul. 2004.

Jan-Ulrich Thiele, M.E. Best, M.F. Toney, D. Weller, "Grain Size Control in FePt Thin Films by Ar-Ion Etched Pt Seed Layers," IEEE Transactions on Magnetics, vol. 37, No. 4, Jul. 2001.

M. Takahashi, H. Shoji, D. D. Djayaprawira, and S. Yoshimura, "Novel Sputtering Process to Reduce the Grain Size and its Distribution in Co-Based Longitudinal Thin Film Media—New Seedlayer and High $K_u^{Grain}$ Material," IEEE Transactions on Magnetics, vol. 36, No. 5, Sep. 2000.

T.C. Arnoldussen, E.M. Rossi, A. Ting, A. Brunsch, J. Schneider, and G. Trippel, "Obliquely Evaporated Iron-Cobalt and Iron-Cobalt-Chromium Thin Film Recording Media," IEEE Transactions on Magnetics, vol. 20, No. 5, Sep. 1984.

M.J. Hadley and R.J. Pollard, "Magnetic and Structural Properties of Co Films Deposited onto Obliquely Sputtered Pt Underlayers," Journal of Applied Physics, vol. 92, No. 12, Dec. 2002.

J.F. Whitacre, Z.U. Rek, J.C. Billello and S.M. Yalisove, "Surface Roughness and In-Plane Texturing in Sputtered Thin Films," Journal of Applied Physics, vol 84, No. 3, Aug. 1998.

R. Moroni, D. Sekiba, F. Bautier de Mongeot, G. Gonella, C. Boragno, L. Mattera, and U. Valbusa, "Uniaxial Magnetic Anisotropy in Nanostructured Co/Cu(001): From Surface Ripples To Nanowires," Physical Review Letters, vol. 91, No. 16, Oct. 2003.

* cited by examiner

MAGNETIC READ SENSOR EMPLOYING OBLIQUE ETCHED UNDERLAYERS FOR INDUCING UNIAXIAL MAGNETIC ANISOTROPY IN A HARD MAGNETIC IN-STACK BIAS LAYER

This application is related to patent application entitled MAGNETIC READ SENSOR EMPLOYING OBLIQUE ETCHED UNDERLAYERS FOR INDUCING UNIAXIAL MAGNETIC ANISOTROPY IN HARD MAGNETIC BIAS LAYERS, application Ser. No. 11/096,636 filed on Mar. 31, 2008 to common inventors.

This application is related to patent application entitled METHOD FOR MANUFACTURING A MAGNETIC READ SENSOR EMPLOYING OBLIQUE ETCHED UNDERLAYERS FOR INDUCING UNIAXIAL MAGNETIC ANISOTROPY IN HARD MAGNETIC BIAS LAYERS, application Ser. No. 11/097,846 filed on Mar. 31, 2005 to common inventors.

This application is related to patent application entitled MAGNETIC READ SENSOR EMPLOYING OBLIQUE ETCHED UNDERLAYERS FOR INDUCING UNIAXIAL MAGNETIC ANISOTROPY IN A HARD MAGNETIC PINNING LAYER, application Ser. No. 11/097,920 filed on Mar. 31, 2005 to common inventors.

This application is related to patent application entitled METHOD FOR MANUFACTURING A MAGNETIC READ SENSOR EMPLOYING OBLIQUE ETCHED UNDERLAYERS FOR INDUCING UNIAXIAL MAGNETIC ANISOTROPY IN A HARD MAGNETIC PINNING LAYER, application Ser. No. 11/097,546 filed on Mar. 31, 2005 to common inventors.

This application is related to patent application entitled, METHOD FOR MANUFACTURING A MAGNETIC READ SENSOR EMPLOYING OBLIQUE ETCHED UNDERLAYERS FOR INDUCING UNIAXIAL MAGNETIC ANISOTROPY IN A HARD MAGNETIC IN-STACK BIAS LAYER application Ser. No. 11/097,543 filed on Mar. 31, 2005 to common inventors.

FIELD OF THE INVENTION

The present invention relates to magnetoresistive field sensors and more particularly to a sensor having an in stack bias layer with strong anisotropy formed on an obliquely etched underlayer.

BACKGROUND OF THE INVENTION

The heart of a computer's long term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has a medium facing surface such as an air bearing surface (ABS). The suspension arm biases the slider toward the surface of the disk and when the disk rotates, air adjacent to the surface of the disk moves along with the disk. The slider flies on this moving air at a very low elevation (fly height) over the surface of the disk. This fly height is on the order of nanometers. When the slider rides on the air bearing, the write and read heads are employed for writing magnetic transitions to and reading magnetic transitions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at a medium facing surface of the write head and the pole piece layers are connected at a back gap. Current conducted to the coil layer induces a magnetic flux in the pole pieces which causes a magnetic field to fringe out at a write gap at the medium facing surface for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. This sensor includes a nonmagnetic conductive layer, hereinafter referred to as a spacer layer, sandwiched between first and second ferromagnetic layers, hereinafter referred to as a pinned layer and a free layer, both of which can be made up by a plurality of layers. First and second leads are connected to the spin valve sensor for conducting a sense current therethrough. The magnetization of the pinned layer is pinned perpendicular to the air bearing surface (medium facing surface) and is relatively insensitive to applied fields. The magnetic moment of the free layer is biased parallel to the medium facing surface, but is free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to $\cos \theta$, where $\theta$ is the angle between the magnetizations of the pinned and free layers. Since $\theta$ is near 90 degrees at zero field, the resistance of the spin valve sensor (for small rotations of the free layer magnetization) changes proportionally to the magnitudes of the magnetic fields from the rotating disk. When a sense current is conducted through the spin valve sensor, resistance changes cause potential changes that are detected and processed as playback signals.

When a spin valve sensor employs a single pinned layer it is referred to as a simple spin valve. When a spin valve employs an antiparallel (AP) pinned layer it is referred to as an AP pinned spin valve. An AP spin valve includes first and second magnetic layers separated by a thin non-magnetic coupling layer such as Ru or Ir. The thickness of the coupling layer is chosen so as to antiparallel couple the magnetic moments of the ferromagnetic layers of the pinned layer. A spin valve is also known as a top or bottom spin valve depending upon whether the pinning layer is at the top (formed after the free layer) or at the bottom (before the free layer).

Magnetization of the pinned layer is usually fixed by exchange coupling one of the ferromagnetic layers (AP1) with a layer of antiferromagnetic material such as PtMn. While an antiferromagnetic (AFM) material such as PtMn does not in and of itself have a net magnetic moment, when exchange coupled with a magnetic material, it can strongly pin the magnetization of the ferromagnetic layer.

A CIP spin valve sensor is located between first and second nonmagnetic electrically insulating read gap layers and the first and second read gap layers are located between ferromagnetic first and second shield layers. In a merged magnetic head a single ferromagnetic layer functions as the second shield layer of the read head and as the first pole piece layer of the write head. In a piggyback head the second shield layer and the first pole piece layer are separate layers.

The ever increasing demand for greater data rate and recording density has lead a push to develop perpendicular to plane (CPP) sensors which are uniquely suited to use in such systems. CPP sensors include both CPP giant magneto-resistive (GMR) sensors, which use electrically conductive spacer layers such as Cu as well as tunnel magneto-resistive (TMR) sensors, which use a thin, electrically insulating barrier layer like Al-oxide. The CPP GMR sensor operates based on spin-dependent bulk and interface scattering of the electrons while the TMR sensor operates based on the spin dependent tunneling of electrons through the barrier layer.

In order to stabilize the free layer in CIP GMR, CPP GMR, or CPP TMR sensors against fluctuations due to thermal agitation and to prevent it from breaking up into domains, it needs to be biased. One form of biasing a sensor is by using an in-stack biasing layer which is separated from the free layer by a non-magnetic spacer layer. The free layer is stabilized magnetostatically by flux closure and is generally antiparrallel to the biasing layer. The biasing layer is typically exchange biased to an antiferromagnet like PtMn or IrMn to pin it in a desired direction parallel to the medium facing surface. Hard magnets like $Co_{1-x}Pt_x$ and $Co_{1-x-y}Pt_xPt_y$ (x being between 10-35 atomic % and y being between 0 and 15 atomic %) are being considered as alternative biasing layer materials. Typically the hard magnetic layer also comprises a seed layer of Cr or CrX (Mo, Ti, V) on which the magnetic $Co_{1-x}Pt_x$ or $Co_{1-x-y}Pt_xCr_y$ material is deposited to achieve crystalline texture and sufficiently high coercivity. The advantage in using a hard magnet like CoPt or CoPtCr lies in that they can be deposited thinner than PtMn pinning layers which is beneficiary for small gaps required for high recording densities. An advantage in particular for CPP GMR and TMR sensors is that CoPt and CoPtCr, but CoPt in particular, typically exhibit somewhat lower resistivity than antiferromagnets such as PtMn or IrMn. Accordingly parasitic resistance is reduced and signal is enhanced.

One major problem with CoPt, CoPtCr and other hard magnets in general is that they are magnetically isotropic in the plane and there is no pair-ordering upon annealing which could establish a magnetic easy axis of the in-stack bias layer in a direction substantially parallel to the medium facing surface. As used herein substantially parallel means that the easy axis is closer to parallel than perpendicular to the medium facing surface. Thus shape anisotropy needs to be employed to obtain an in-plane easy axis. However utilizing shape anisotropy would require an in-stack biasing layer with large trackwidth and low stripe-height which imposes a geometric constraint on the sensor. This is undesirable for high magnetic recording densities.

Therefore, there is a strong felt need for a mechanism to generate a uniaxial magnetic anisotropy other than shape anisotropy to set the magnetic anisotropy of a hard magnetic layer such as CoPt or CoPtCr in a user defined direction independent of the shape of the sensor.

SUMMARY OF THE INVENTION

The present invention provides a hard magnetic in-stack bias layer structure having a magnetic easy axis (magnetic anisotropy) oriented in a specific direction substantially parallel with the medium facing surface. The in-stack bias layer structure biases the free layer via magnetostatic coupling. The sensor includes a sensor stack including a layer of hard magnetic material deposited over an underlayer that has been ion beam etched at an angle with respect to the normal of the surface of the underlayer to induce anisotropic roughness for example in form of oriented ripples or facets in the surface of the underlayer.

The underlayer may comprise Pt, Ta, PtMn, Cr, Ru, W, Mo, Cu, or their alloys or other preferably crystalline materials. The in stack bias layer deposited thereover may be, for example, CoPt, CoPtCr, typically on a seed layer of Cr or a Cr-alloy, or some other hard magnetic material on a suitable seed layer. The anisotropic roughness, can be for example in form of oriented ripples or facets, induced by this ion etch that may run along a direction substantially perpendicular to the medium facing surface and induces a strong magnetic uniaxial anisotropy in the subsequently deposited hard magnetic in-stack biasing layers in a direction substantially parallel to the medium facing surface.

The strong uniaxial magnetic anisotropy produced by the present invention ensures sufficient magnetic biasing of the free layer even at the extremely small sensor sizes of present and future generation sensors. The magnetic anisotropy of the in stack bias layer also prevents loss of free layer biasing during high temperature events such as from a head disk contact.

These and other advantages and features of the present invention will be apparent upon reading the following detailed description in conjunction with the Figures.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
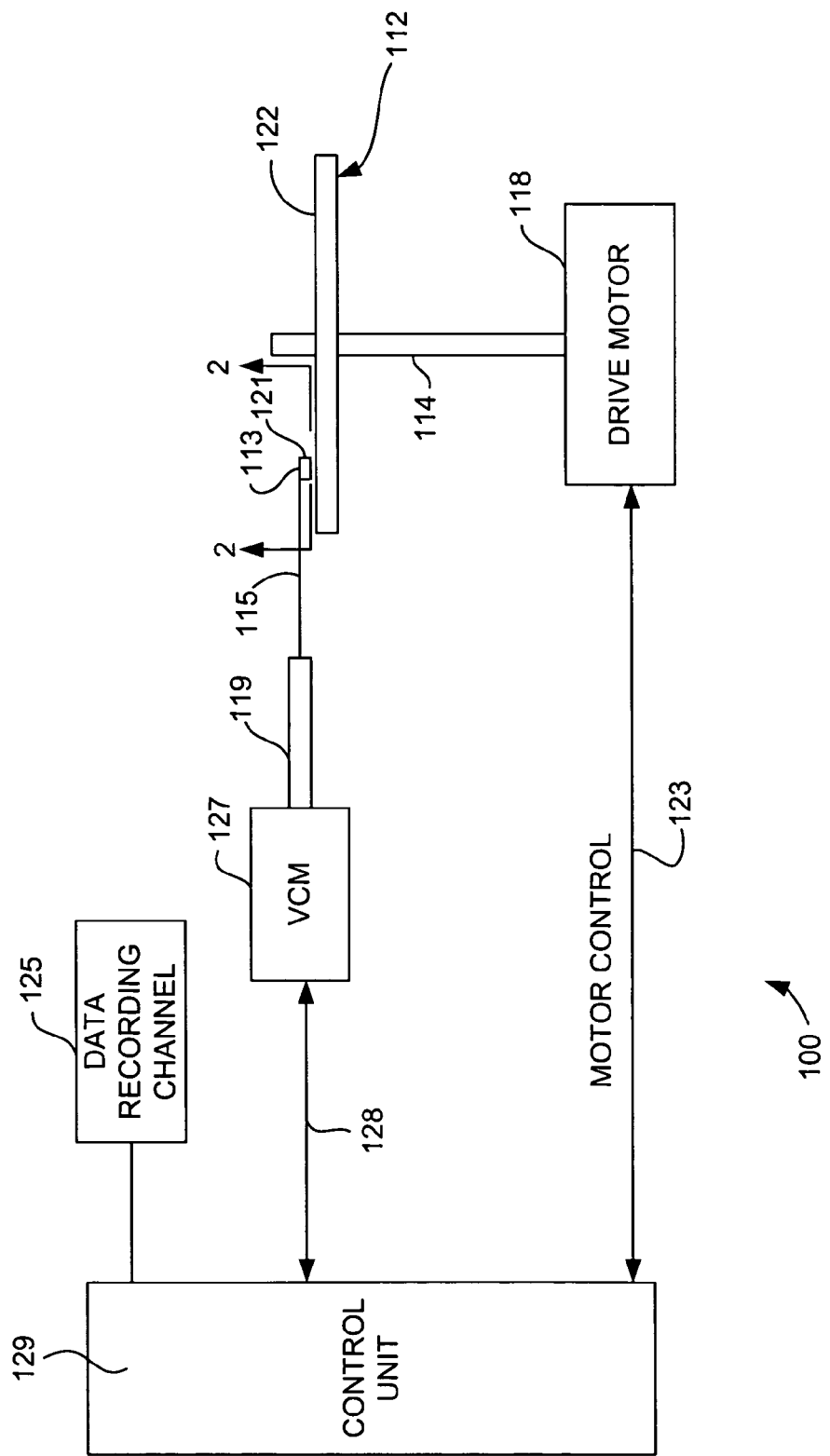
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
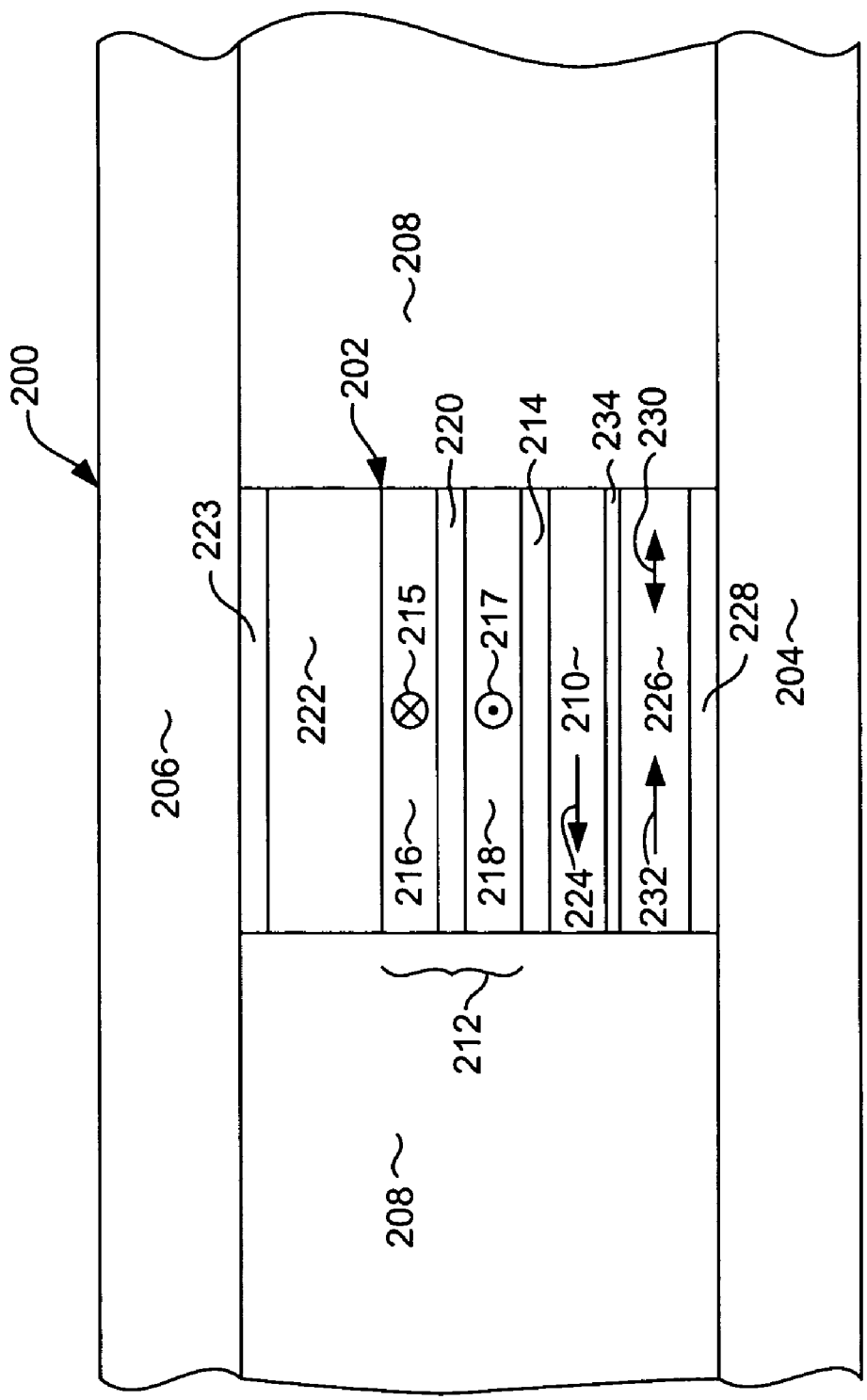
FIG. 2 is an ABS view of a CPP sensor according to present invention.
Figure 3A:
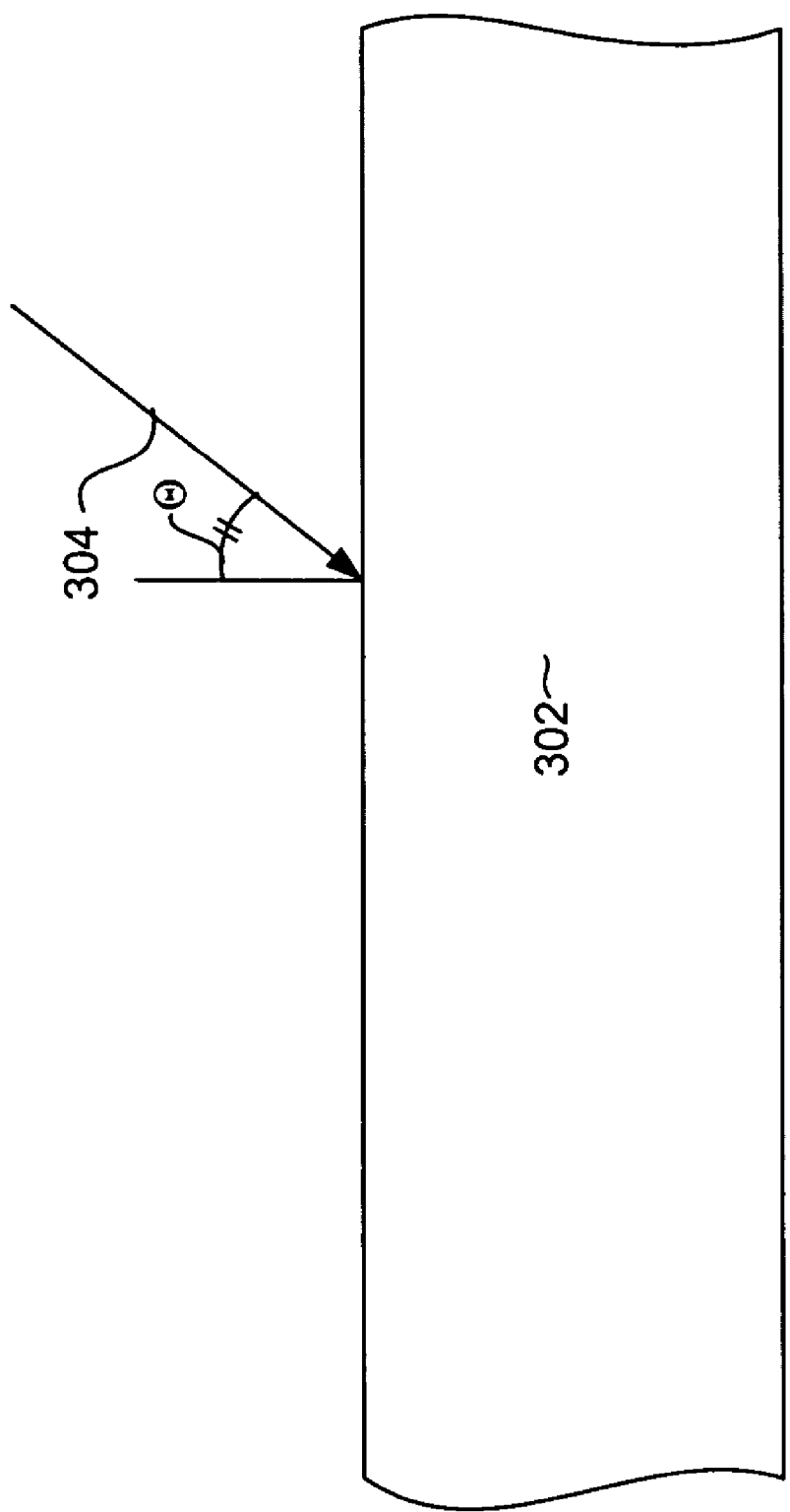
FIGS. 3A through 3D are cross sectional views illustrating a method of setting magnetic anisotropy in a magnetic layer according to the present invention.
Figure 3B:
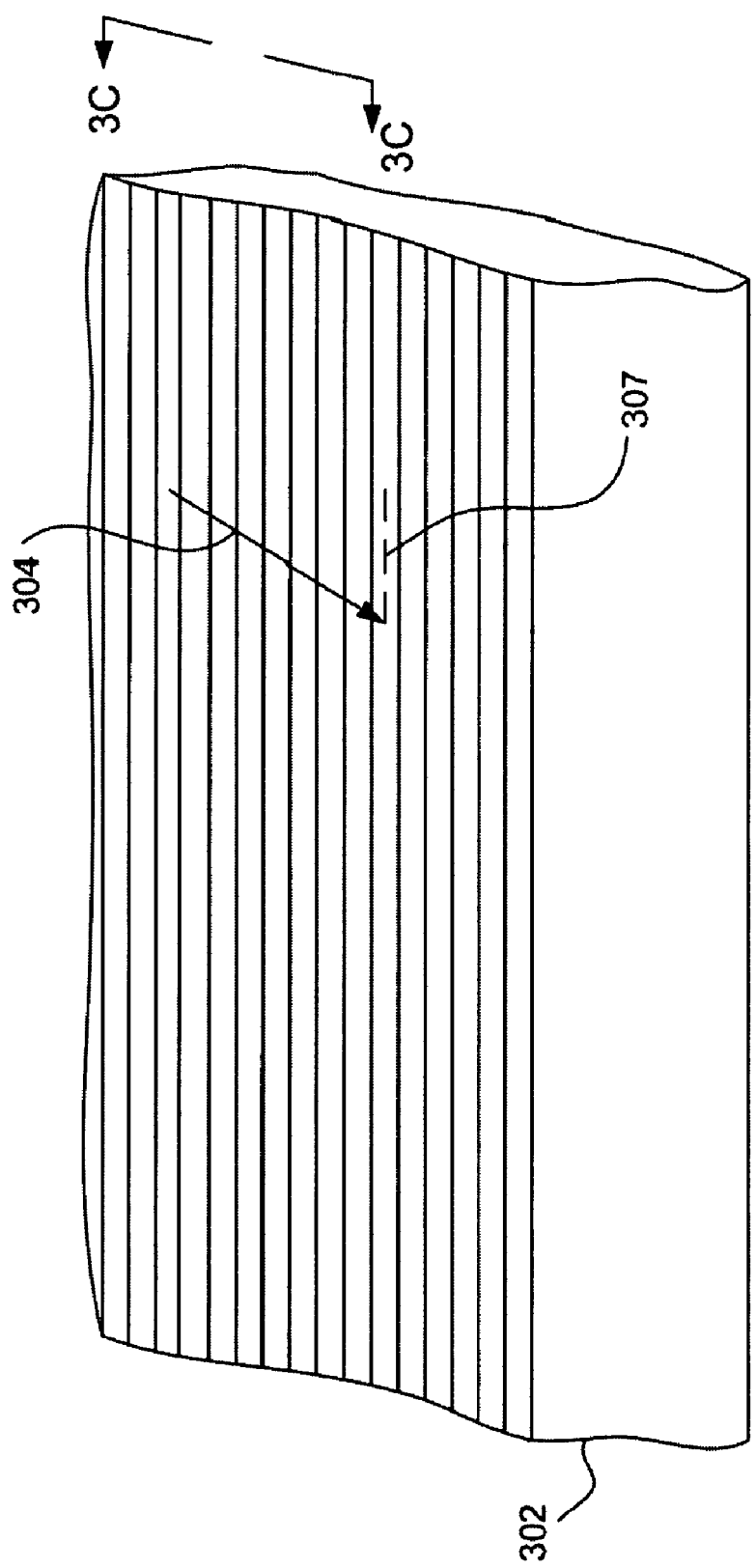
Figure 3C:
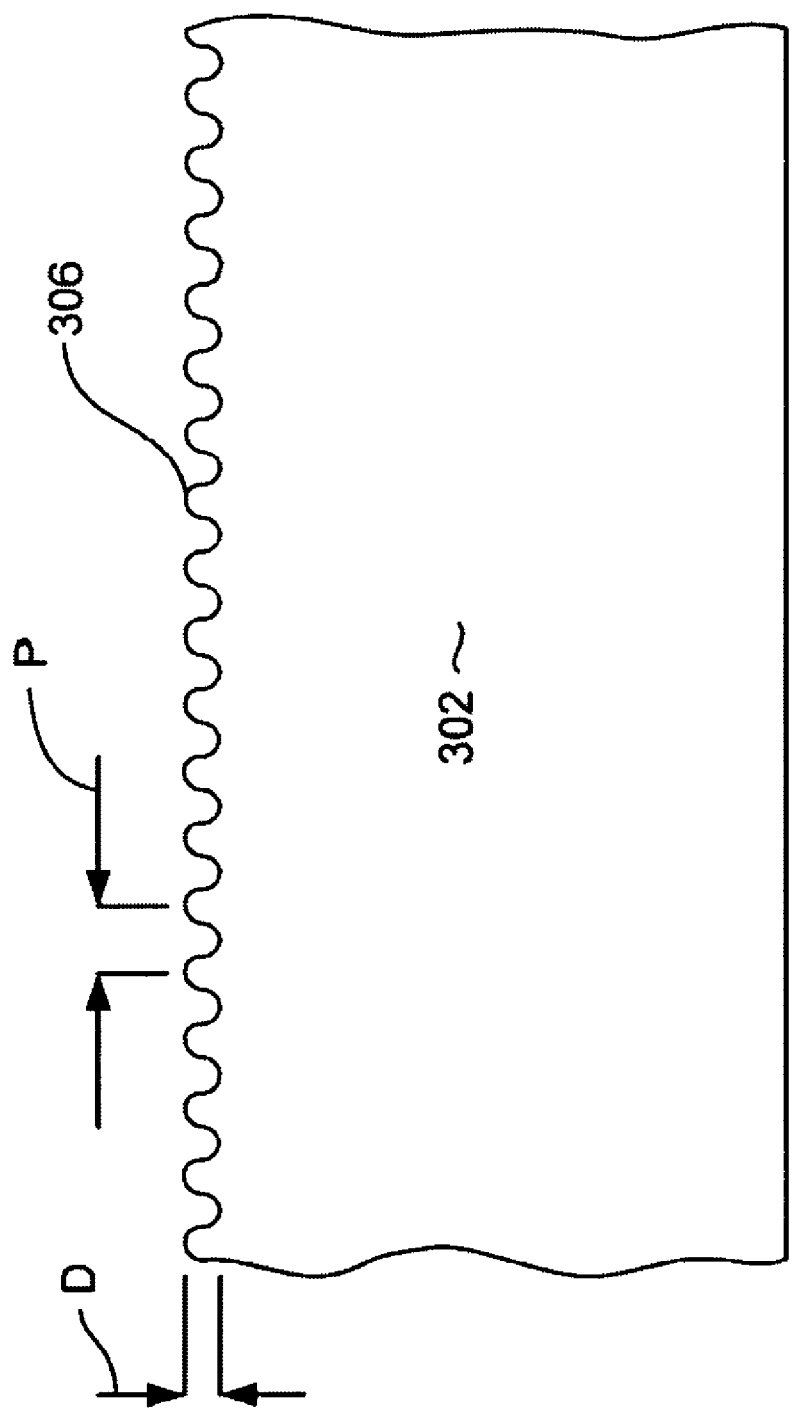
Figure 3D:
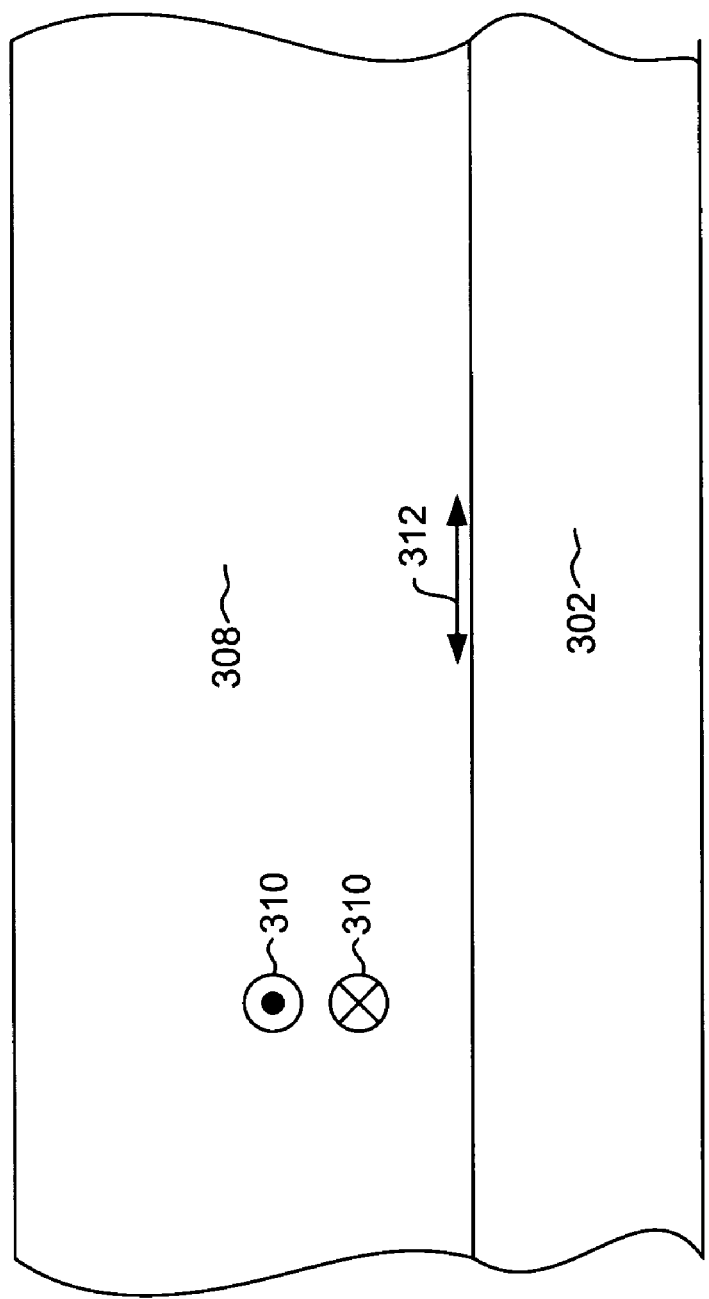

With reference now to FIG. 2, a magnetoresistive sensor 200 according to present embodiment could be a CPP GMR senor, CIP GMR sensor, or tunnel valve sensor, but will be described in terms of a CPP GMR sensor. The sensor 200 includes a sensor stack 202 sandwiched between first and second electrically conductive magnetic leads 204, 206 which also serve as magnetic shields. The leads 204, 206 can be for example NiFe or some other magnetic material. An insulation layer 208 is provided between the leads 204, 206 and can be for example Alumina $Al_2O_3$.

The sensor stack 202 includes a free layer 210, and a pinned layer structure 212. The free and pinned layers 210, 212 are separated from one another by a non-magnetic, electrically conductive spacer layer 214, which can be for example Cu. If the sensor 200 were a tunnel valve sensor, the layer 214 would be a non-magnetic, electrically insulating barrier layer such as alumina. The free layer 210 can be constructed of one or more layers of for example NiFe, Co, CoFe, or other sufficiently soft magnetic material, preferably with a layer of Co or CoFe adjacent to the spacer layer 214. The pinned layer structure 212 may be a simple, single layer pinned structure, but is more preferably an AP coupled pinned layer structure having first and second magnetic layers AP1 216 and AP2 218, both of which may be constructed of CoFe or some other suitable material. The AP1 and AP2 layers 216, 218 are antiparallel coupled across a coupling layer 220, which can be for example Ru or Ir and has a thickness chosen to strongly antiparallel couple the magnetic moments 215, and 217 of the AP1 and AP2 layer, respectively. The coupling layer can be for example 2-10 Angstroms thick or about 8 Angstroms thick. The AP1 layer 216 is exchange coupled with a layer of antiferromagnetoic (AFM) material 222 for example PtMn or IrMn which strongly pins the magnetic moment 215 in a desired direction perpendicular to the medium facing surface (transverse direction), which may be an air bearing surface (ABS) or a contact bearing surface. Due to the AP coupling of the AP1 and AP2 layers 216 and 218, respectively, this also pins the moment 217 of the AP2 layer in a desired direction perpendicular to the medium facing surface, but antiparallel with the moment 215 of the AP1 layer. Alternatively, the pinned layer 212 could be biased by replacing the AFM material with hard magnetic material 222 of sufficient coercivity, remanence, and anisotropy. Alternatively, the pinned layer 212 could be self pinned, in which case pinning would be maintained by a combination of magnetostriction induced anisotropy of the AP1 and AP2 layers 216 and 218, respectively and the strong antiparallel coupling of the layers 216, 218. In this case a pinning layer 222 is obsolete. A capping layer 223, such as Ta may be provided to protect the sensor layers from damage during manufacturing.

With continued reference to FIG. 2, the free layer 210 has a magnetic moment 224 that is biased in a desired direction parallel with the medium facing surface (longitudinal direction). The free layer moment biasing is maintained by an in stack bias layer 226, which has been deposited on an underlayer 228. The underlayer 228 is constructed by the method described above with reference to FIG. 2, in which a layer of material such as Pt, Ta, PtMn, Cr, Ru, W, Mo, Cu, or their alloys or some other suitable, preferably crystalline material is deposited and has been treated with an ion etch as described in FIGS. 3A-3D in order to create anisotropic roughness on the surface of the underlayer 228 and to induce a magnetic anisotropy axis 230 in the in-stack bias layer 226 in a direction substantially parallel to the medium facing surface. This means that the underlayer 228 has been ion beam etched prior to deposition of the hard magnetic in-stack bias layer 226 at an angle and direction that must be chosen such that the resulting magnetic easy axis of the hard magnetic in-stack bias layer 226 is substantially parallel to the medium facing surface.

The underlayer 228 may have a thickness of 30 to 300 Angstroms after etching and exhibits anisotropic roughness for example in form of oriented ripples or facets in its upper surface or interface (adjacent to the bias layer 226) oriented along a direction substantially perpendicular to the medium facing surface (into and out of the plane of the page in FIG. 2). The upper surface of the underlayer may have been oxidized prior to deposition of the hard magnetic in-stack bias layer.

The in-stack bias layer 226, when deposited onto the treated underlayer 226 has an easy axis 230 aligned in the longitudinal direction and is preferably constructed of a magnetic material having a high coercivity, such as CoPt or CoPtCr. A layer of Cr or CrX (X=Mo, Ti, V) may also be provided on top of the underlayer 228. The induced uniaxial anisotropy of the bias layer 226 cause the magnetic moment 232 of the bias layer 226 to be maintained in a desired direction parallel with the medium facing surface (longitudinal direction).

A coupling layer 234 is provided between the free layer 210 and the bias layer 226. The coupling layer may be for example Ta and is constructed of such a thickness as to weakly antiparallel couple the free layer 210 and the bias layer 226. This thickness can be for example 10-30 Angstroms and allows the free layer moment 224 to be biased in the desired direction.

With reference to FIGS. 3A through 3D, The underlayer 228 (FIG. 2) is constructed by depositing a material 302, which could be for example Pt, Ta, PtMn, Cr, Ru, W, Mo, Cu, or their alloys or some other preferably crystalline material. The underlayer material 302 can be for example 50 to 300 Angstroms or about 100 Angstroms thick after etching. An ion beam etch 304 is then performed at an angle Θ with respect to a normal to the surface of the underlayer 302. The angled ion etch induced anisotropic roughness for example in form of oriented ripples or facets 306 that run in a direction substantially parallel to the in plane projection 307 of the ion beam onto the surface of the layer 302. A typical, average pitch P of the ripples 306 is between 10-500 nm, and their average depth D is 0.5 to 5 nm or about 1 nm.

After the angled ion etch 304 has been performed sufficiently to form the desired ripples or facets 306, a layer of hard magnetic material 308 (FIG. 3D) is deposited. The hard magnetic material 308 can be for example CoPt or CoPtCr can include multiple layers, such as a layer of Cr or CrX (X=Mo, Ti, V) and a layer of CoPt or CoPtCr. The easy axis 310 of the hard magnetic material 308 will be substantially perpendicular to the direction 312 of the ripples and perpendicular to the in plane projection 306 (FIG. 3B) of the angled ion etch onto the surface of the under layer 302. If another suitable hard magnetic material is used instead of CoPt or CoPtCr the magnetic easy axis may be either substantially parallel or substantially perpendicular to the direction 312 of the ripples. The ion etch direction must be chosen such that the resulting magnetic easy axis of the hard magnetic layer is substantially parallel to the medium facing surface.

The angled ion etch 304 is preferably performed at an angle of between 20 and 80 degrees and is more preferably performed at an angle of between 35 and 65 degrees with respect to the normal to the surface of the underlayer 302. The exact voltage, current, and angle conditions depend on the type and characteristics of the ion source in use.

In one demonstration of the above described treatment method, about 300 Angstroms of Ta were deposited and etched under an angle of about 45 degrees from normal for 1200 seconds at an ion source voltage of 100 Volts and a flux of 1 Ampere. The etch rate was about 5-7 Angstroms per minute. The Ta samples were taken out of vacuum and reintroduced into another deposition system. Thus some oxide layer formed on the top of the Ta. Finally a seed layer of about 30 Angstroms of Cr, about 50 Angstroms of $Co_{82}Pt_{18}$ hard magnetic bias material, and about 50 Angstroms of Ru, and about 25 Angstroms of Ta cap material were deposited onto the treated underlayer. Magnetization measurements shown in FIG. 4 demonstrate that a uniaxial anisotropy is introduced by the ion beam etch. The easy axis is perpendicular to the in-plane projection of the ion beam during etching. The structural origin was investigated by X-ray diffraction. The reflectivity rocking curves of an etched Ta substrate taken with the projection of the X-rays and the ion beam parallel and perpendicular to each other exhibit an enhancement of the diffusive background in the direction perpendicular to the ion beam. This is a clear indication of the change in substrate morphology with anisotropic roughness for example in form of oriented ripples or facets running along the direction of the ion beam. The $Co_{82}Pt_{18}$ easy axis is perpendicular to axis of the ripples or facets. Underlayers with various crystalline structures including Ta (body centered tetragonal), Cr (body centered cubic), PtMn (body centered tetragonal), Cu (face centered cubic), and Ru (hexagonal closed packed) have been ion beam etched in a fashion similar to what is described above and a Cr(35)/$CoPt_{18}$(50) bilayer was deposited on top. Magnetic measurements revealed a $CoPt_{18}$ easy axis perpendicular to the ion beam direction showing that the effect is independent of the type of crystalline structure.

Figure 4:
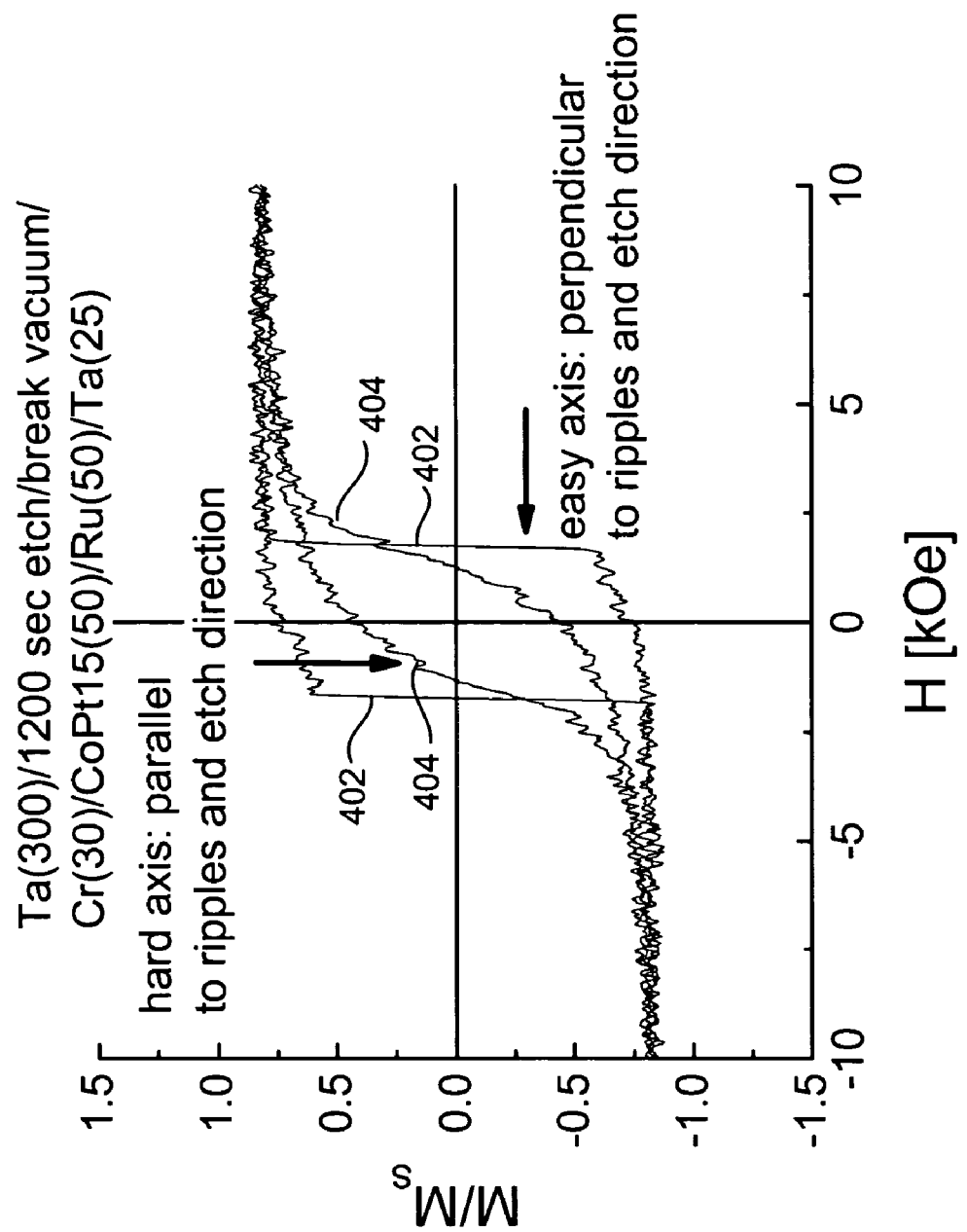
FIG. 4 Magnetic hysteresis loops of a $Cr(30)/Co_{82}Pt_{18}$ (50) film grown onto a 1200 seconds etched Ta underlayer measured perpendicular and parallel to the ion-beam direction.

FIG. 4 shows magnetic hysteresis loops of the in stack bias layer 226 formed over the under layer 228 treated as described above. The lines 402 show the hysteresis loop in response to a magnetic field parallel with the easy axis of the in stack bias layer 226. The lines 404 show the hysteresis loops in response to a magnetic field that is perpendicular to the easy axis of the in stack bias layer 226.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetoresistive sensor comprising:
   an underlayer;
   a hard magnetic layer formed over the underlayer;
   a non-magnetic coupling layer formed over the hard magnetic layer; and
   a magnetic free layer formed over the coupling layer;
   wherein the underlayer has an anisotropic roughness at an surface between the hard magnetic layer and the underlayer.

2. A magnetoresistive sensor as in claim 1, wherein the sensor has a medium facing surface and wherein the hard magnetic layer has a magnetic anisotropy oriented substantially parallel to the medium facing surface.

3. A magnetoresistive sensor as in claim 1, wherein the sensor has a medium facing surface and wherein the anisotropic roughness comprises ripples or facets.

4. A magnetoresistive sensor as in claim 1, wherein the sensor has a medium facing surface and wherein the anisotropic roughness comprises ripples or facets that extend along a direction substantially perpendicular to the medium facing surface.

5. A magnetoresistive sensor as in claim 1 wherein the underlayer comprises a material having a crystalline structure.

6. A magnetoresistive sensor as in claim 1 wherein the underlayer comprises a material having body centered cubic or body centered tetragonal crystal structure.

7. A magnetoresistive sensor as in claim 1 wherein the underlayer comprises a material having face centered cubic or face centered tetragonal crystal structure.

8. A magnetoresistive sensor as in claim 1 wherein the underlayer comprises a material having hexagonally closed packed crystal structure.

9. A magnetoresistive sensor as in claim 1 wherein the underlayer comprises Pt, Ta, PtMn, Cr, Ru, W, Mo, or Cu.

10. A magnetoresistive sensor as in claim 1 wherein the surface of the underlayer is oxidized.

11. A magnetoresistive sensor as in claim 1 wherein the upper surface of the underlayer exhibits anisotropic roughness in the form of ripples having an average pitch of 10-500 nm.

12. A magnetoresistive sensor as in claim 1 wherein the upper surface of the underlayer exhibits an anisotropic roughness in form of ripples having an average depth of 0.5-5 nm.

13. A magnetoresistive sensor as in claim 1 wherein the underlayer has a thickness of 30-300 Angstroms after ion beam etching.

14. A magnetoresistive sensor as in claim 1 wherein the hard magnetic in-stack bias layer comprises an alloy of Co and Pt.

15. A magnetoresistive sensor as in claim 1 wherein a crystalline seed layer is disposed between the underlayer and the hard magnetic layer and wherein the hard magnetic layer comprising an alloy of Co and Pt.

16. A magnetoresistive sensor as in claim 1 wherein a seed layer of Cr or CrX (X=Mo, Ti, V) is disposed between the underlayer and the hard magnetic layer and wherein the hard magnetic layer comprises comprising an alloy of Co and Pt.

17. A magnetoresistive sensor as in claim 1 wherein the hard magnetic layer comprises an alloy of CoPt$_x$Cr$_y$, x being between 10 and 35 atomic percent and y being between 0 and 15 atomic percent.

18. A magnetoresistive sensor as in claim 1 wherein a crystalline seed layer is disposed between the underlayer and the hard magnetic layer and wherein the hard magnetic layer comprises CoPt$_x$Cr$_y$, x being between 10 and 35 atomic percent and y being between 0 and 15 atomic percent.

19. A magnetoresistive sensor as in claim 1 wherein a seed layer of Cr or CrX (X=Mo, Ti, V) is disposed between the underlayer and the hard magnetic layer and wherein the hard magnetic layer comprises CoPt$_x$Cr$_y$, x being between 10 and 35 atomic percent and y being between 0 and 15 atomic percent.

20. A magnetoresistive sensor as in claim 1 wherein the hard magnetic layer comprises an alloy of Co and the wherein the underlayer comprises a material having a crystalline structure.

21. A magnetoresistive sensor as in claim 1 wherein the hard magnetic layer comprises an alloy of CoPt$_x$Cr$_y$, x being between 10 and 35 atomic percent and y being between 0 and 15 atomic percent and wherein the underlayer comprises a material having crystalline structure.

22. A magnetoresistive sensor as in claim 1 wherein the hard magnetic layer comprises an alloy of CoPt$_x$Cr$_y$, x being between 10 and 35 atomic percent and y being between 0 and 15 atomic percent and wherein the underlayer comprises a material selected from the group consisting of Pt, Ta, PtMn, Cr, Ru, W, Mo, or Cu.

23. A magnetoresistive sensor as in claim 1 wherein the coupling layer comprises Ta.

24. A magnetoresistive sensor as in claim 1 wherein the coupling layer comprises Ta having a thickness of 10-30 Angstroms.

25. A magnetoresistive sensor as in claim 1 wherein the magnetic free layer comprises NiFe or CoFe.

26. A magnetoresistive sensor as in claim 1 wherein the free layer and the hard magnetic layer are antiparallel coupled across the coupling layer.

27. A magnetoresistive sensor as in claim 1 wherein the sensor is a tunnel valve.

28. A magnetoresistive sensor as in claim 1 wherein the sensor is a current perpendicular to the plane GMR sensor.

29. A magnetic data recording system, comprising:
a magnetic medium;
a slider;
an actuator connected with the slider for moving the slider adjacent to a surface of the magnetic medium;
a magnetoresistive sensor, connected with the slider and having an air bearing surface, the magnetoresistive sensor comprising:
an underlayer;
a hard magnetic layer formed over the underlayer;
a non-magnetic coupling layer formed over the hard magnetic layer; and
a magnetic free layer formed over the coupling layer;
wherein the underlayer has an anisotropic roughness at a surface between the hard magnetic layer and the underlayer.

30. A magnetic data recording system as in claim 29 wherein the sensor is a tunnel valve.

31. A magnetic data recording system as in claim 29 wherein the sensor is a current perpendicular to plane GMR sensor.

* * * * *

UNITED STATES PATENT AND TRADEMARK OFFICE
CERTIFICATE OF CORRECTION

| | | |
|---|---|---|
| PATENT NO. | : 7,460,343 B2 | Page 1 of 1 |
| APPLICATION NO. | : 11/097638 | |
| DATED | : December 2, 2008 | |
| INVENTOR(S) | : Carey et al. | |

It is certified that error appears in the above-identified patent and that said Letters Patent is hereby corrected as shown below:

In claim 15, column 9, line 4 replace "comprising" with --comprises--.

In claim 16, column 9, line 8 replace "comprises comprising an alloy" with --comprising an alloy--.

Signed and Sealed this

Twenty-seventh Day of July, 2010

David J. Kappos
*Director of the United States Patent and Trademark Office*